(12) United States Patent
Wakabayashi

(10) Patent No.: US 8,025,475 B2
(45) Date of Patent: Sep. 27, 2011

(54) WAFER TRANSFER APPARATUS, WAFER TRANSFER METHOD AND STORAGE MEDIUM

(75) Inventor: Shinji Wakabayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1067 days.

(21) Appl. No.: 11/892,677

(22) Filed: Aug. 24, 2007

(65) Prior Publication Data

US 2009/0053023 A1    Feb. 26, 2009

Related U.S. Application Data

(60) Provisional application No. 60/844,651, filed on Sep. 15, 2006.

(30) Foreign Application Priority Data

Aug. 25, 2006    (JP) ................................. 2006-229635

(51) Int. Cl.
G06F 7/00 (2006.01)
(52) U.S. Cl. ........................................ 414/936; 700/218
(58) Field of Classification Search ............... 414/744.5, 414/935, 936, 937, 938, 939, 940, 941; 700/218, 700/229, 245, 214, 228
See application file for complete search history.

(56) References Cited

U.S. PATENT DOCUMENTS

| 4,819,167 | A * | 4/1989 | Cheng et al. .................... 700/59 |
| 5,483,138 | A * | 1/1996 | Shmookler et al. ...... 318/568.16 |
| 6,085,125 | A * | 7/2000 | Genov .......................... 700/218 |
| 6,405,101 | B1 * | 6/2002 | Johanson et al. ............. 700/218 |
| 6,510,365 | B1 * | 1/2003 | Nishinakayama et al. ... 700/214 |
| 6,742,980 | B2 * | 6/2004 | Sasaki ............................ 414/783 |
| 6,950,721 | B2 * | 9/2005 | Tashiro et al. ................ 700/213 |
| 6,983,195 | B2 * | 1/2006 | Iijima et al. ................... 700/218 |
| 7,004,716 | B2 * | 2/2006 | Graf et al. ..................... 414/754 |
| 2004/0068347 | A1 * | 4/2004 | Aalund et al. ................ 700/245 |
| 2006/0020367 | A1 * | 1/2006 | Nangoy ......................... 700/245 |

FOREIGN PATENT DOCUMENTS

JP    64-48443    2/1989

* cited by examiner

*Primary Examiner* — Khoi Tran
*Assistant Examiner* — Stephen Holwerda
(74) *Attorney, Agent, or Firm* — Smith, Gambrell & Russell, LLP (57) ABSTRACT

One sensor constituted of a light emission element and a light-receiving element is provided in a path through which a wafer is transferred. The sensor is positioned so that the wafer passes through an area between the light emission element and the light-receiving element. Coordinates of the center of the wafer are calculated based on encoder values obtained when the wafer starts passing through the sensor and when the wafer completes passing through the sensor, position data of wafer transfer arm corresponding to the encoder value, and the diameter of the wafer; and thereby the amount of positional deviation of the center of the wafer from a reference position is calculated.

11 Claims, 10 Drawing Sheets

WAFER TRANSFER APPARATUS, WAFER TRANSFER METHOD AND STORAGE MEDIUM

CROSS REFERENCE TO RELATED APPLICATION

The present application claims the benefit of U.S. provisional application No. 60/844,651, filed Sep. 15, 2006 which is incorporated herein by reference in its entirety.

TECHNICAL FIELD

The present invention relates to a technique for measuring the positional deviation a wafer mounted on transfer means in a transfer apparatus for transferring the wafer.

BACKGROUND ART

When a wafer is processed in a semiconductor manufacturing system, the orientation of the wafer is typically aligned by an alignment mechanism in advance on the basis of a notch (V-shaped slit indicating a reference direction corresponding to the direction of a crystal array of the wafer). The alignment mechanism mounts the wafer on its rotatable stage, and rotates the wafer by 360° or more, and then detects the direction of the wafer on the basis of obtained data of the peripheral edge of the wafer. In this case, the alignment mechanism usually adopts a method that pushes the wafer at, for example, three points on the periphery of the wafer to center the wafer; or a method that calculates the positional deviation of the center of the wafer on the basis of the profile data of the wafer periphery and causes a transfer arm to receive the wafer such that the positional deviation is corrected.

A so-called multi-chamber system in which a plurality of process chambers are connected to a transfer chamber is also equipped with an alignment mechanism. When a wafer is transferred from the alignment mechanism to the process chamber, there is a possibility that, for example, a malfunction of a transfer arm will cause a positional deviation of the wafer. In addition, when a processed wafer is removed from an electrostatic chuck, there is also a possibility that a residual electric charge may cause excessive force to act on the wafer to displace the wafer. If the wafer displaces from its proper position on the transfer arm, when the wafer passes through a transfer port of a process chamber and that of a load lock chamber, there is a possibility that the wafer will collide with the chamber wall. Moreover, in the case of a wafer before processed, even if the wafer is carried into the process chamber, the wafer is not correctly mounted on a mounting table. Therefore, it is not possible to ensure the in-plane uniformity of the process. For this reason, in the multi-chamber system, the position of a wafer mounted on the transfer arm is detected by use of wafer detection sensors.

With the use of such detection sensors, in one example, the detection of the wafer position is performed by stopping a transfer arm, and then detecting the peripheral edge of the wafer by three sensors and calculating the center position of the wafer on the basis of the result of the detection. In another example, the detection of the wafer position is performed by moving a transfer arm so that the wafer crosses detection areas of two sensors, and calculating the center position of the wafer on the basis of each encoder value obtained when the wafer crosses the detection areas of the two sensors.

Incidentally, in order to quickly detect the positional deviation of a wafer mounted on a transfer arm, it is desirable to provide a system with a plurality of monitoring (position-detecting) areas. However, since the foregoing sensors configured to detect the wafer position when the transfer arm is stopped is expensive, the provision of plural monitoring areas leads to increase in the total cost of the system. In addition, in a case where plural sensors are provided in one monitoring area and plural monitoring areas are provided in a system, the layout of the sensors becomes difficult. Moreover, if the number of sensors is large, it is possible that the positional relationship between the sensors is not accurate. Inaccurate positional relationship between the sensors will result in an error in calculating the center position of the wafer. JP01-48443A (page 18, upper part; FIG. 2 to 5) discloses a technique for detecting a deviation in the position of a wafer while a transfer arm is moved. However, this technique cannot solve the foregoing problems.

SUMMARY OF THE INVENTION

The present invention was made in view of the foregoing circumstances. The object of the present invention is to provide a technique that is capable to reducing the number of wafer detection sensors for detecting the position of a wafer mounted on transfer means in a transfer apparatus for transferring the wafer, thereby providing a system at a low cost. Another object of the present invention is to provide a technique capable of determining the position of a wafer mounted on a transfer means with high accuracy.

According to the present invention, there is provided a wafer transfer apparatus that transfers a wafer while the wafer is mounted on a movable transfer arm, the apparatus including: one wafer detection sensor provided at a position at which it is possible for the detection sensor to judge whether or not a wafer mounted on the transfer arm is passing through a detection area of the detection sensor when the transfer arm moves; position data acquiring means that acquires position data of the transfer arm based on an amount of driving of the transfer arm; a storage unit that stores reference position data corresponding to a reference position of the wafer mounted on the transfer arm; and calculation means that determines, based on the position data acquired by the position data acquiring means and a result of judgment of the wafer detection sensor, position data of the transfer arm at a point of time at which the wafer starts passing through the detection area of the wafer detection sensor, and position data of the transfer arm at a point of time at which the wafer completes passing through the detection area, and then calculates an amount of positional deviation of a center of the wafer based on those position data of the transfer arm thus determined, the reference position data and a diameter of the wafer.

The transfer arm may be configured to be driven such that the wafer passes linearly through the detection area of the wafer detection sensor.

Preferably, the calculation means is configured to calculate the amount of positional deviation of the center of the wafer by using, as said diameter of wafer, a correct diameter of the wafer that is determined based on position data of a periphery of the wafer obtained when the wafer is rotated by a rotary stage to adjust an orientation of the wafer.

In one preferred embodiment, the position at which the wafer detection sensor is provided is such a position that at which it is also possible for the detection sensor to judge whether or not the transfer arm passing through the detection area of the wafer detection sensor, and the apparatus further include judgment means that determines, based on a position data acquired by the position data acquiring means and the result of judgment by the wafer detection sensor, position data of the transfer arm at a point of time at which the transfer arm starts passing through the detection area of the wafer detection sensor or position data of the transfer arm at a point of time at which the transfer arm completes passing through the detection area, and then judges, by comparing the position data thus determined with position data to be obtained when the transfer arm is in normal operation, whether or not the transfer arm is in normal operation.

The present invention also provides a wafer transfer apparatus that transfers a wafer while the wafer is mounted on a movable transfer arm, the apparatus including: at least one wafer detection sensor provided at a position at which it is possible for the detection sensor to judge whether or not a wafer mounted on the transfer arm is passing through a detection area of the detection sensor when the transfer arm moves; position data acquiring means that acquires position data of the transfer arm based on an amount of driving of the transfer arm; a storage unit that stores reference position data corresponding to a reference position of the wafer mounted on the transfer arm; and calculation means that calculates an amount of positional deviation of a center of the wafer based on the position data acquired by the position data acquiring means, a result of judgment of the wafer detection sensor and a diameter of the wafer, the diameter of wafer being obtained based on position data of a periphery of the wafer obtained when the wafer is rotated by a rotary stage to adjust an orientation of the wafer.

The wafer transfer apparatus may further includes: judgment means that judges whether or not the amount of the positional deviation of the center of the wafer exceeds a threshold value; and alarm means that alarms that the amount of deviation exceeds the threshold value.

The transfer apparatus may be configured so that the transfer arm mounts the wafer to a transfer destination so that the positional deviation of the center of the wafer is corrected, if it is judged that the amount of the positional deviation does not exceed the threshold value.

According to another aspect of the present invention, there is provided a wafer transfer method for transferring a wafer while the wafer is mounted on a movable transfer arm, the method including the steps of: moving the transfer arm to allow the wafer to pass through a detection area of one wafer detection sensor, the wafer detection sensor being configured to be capable of judging whether or not the wafer mounted on the transfer arm is passing through the detection area of the detection sensor; detecting passage of the wafer through the detection area of the wafer detection sensor by means of the wafer detection sensor; acquiring first position data of the transfer arm at a point of time when the wafer starts passing through the detection area, based on an amount of driving of the transfer arm; acquiring second position data of the transfer arm at a point of time when the wafer completes passing through the detection area, based on an amount of driving of the transfer arm; and calculating an amount of positional deviation of a center of the wafer based on the first and second position data of the transfer arm, reference position data corresponding to a reference position of the wafer mounted on the transfer arm, and a diameter of the wafer.

Preferably, the step of calculating the amount of positional deviation is performed by using, as said diameter of wafer, a correct diameter of the wafer that is determined based on position data of a periphery of the wafer obtained when the wafer is rotated by a rotary stage to adjust an orientation of the wafer.

The wafer transfer method may further include the steps of: detecting passage of the transfer arm through the detection area of the wafer detection sensor by means of the wafer detection sensor, when moving the transfer arm; acquiring third position data of the transfer arm at a point of time when the transfer arm starts passing or completes passing through the detection area, based on an amount of driving of the transfer arm; and judging whether or not the transfer arm is in normal operation, by comparing the third position data of the transfer arm with position data to be obtained when the transfer arm is in normal operation.

The present invention further provides a wafer transfer method for transferring a wafer while the wafer is mounted on a movable transfer arm, the method including the steps of: moving the transfer arm to allow the wafer to pass through a detection area of at least one wafer detection sensor, the wafer detection sensor being configured to be capable of judging whether or not the wafer mounted on the transfer arm is passing through the detection area of the detection sensor; detecting passage of the wafer through the detection area of the wafer detection sensor by means of the wafer detection sensor; acquiring first position data of the transfer arm at a point of time when the wafer starts passing through the detection area, based on an amount of driving of the transfer arm; acquiring second position data of the transfer arm at a point of time when the wafer completes passing through the detection area, based on an amount of driving of the transfer arm; and calculating an amount of positional deviation of a center of the wafer based on the first and second position data of the transfer arm, reference position data corresponding to a reference position of the wafer mounted on the transfer arm, and a diameter of the wafer that is determined based on position data of a periphery of the wafer obtained when the wafer is rotated by a rotary stage to adjust an orientation of the wafer.

The wafer transfer method may further include a step of judging whether or not the amount of the positional deviation of the center of the wafer exceeds a threshold value, and notifying that an abnormality occurs if it is judged that the amount of the positional deviation of the center of the wafer exceeds the threshold value.

The wafer transfer method may include a step of mounting the wafer to a transfer destination so that the positional deviation of the center of the wafer is corrected if it is judged that the amount of the positional deviation does not exceed the threshold value.

According to still another aspect of the present invention, there is provide a storage medium storing a computer program operable on a computer for controlling a wafer transfer apparatus, wherein the computer program includes programmed steps for executing any one of the foregoing wafer transfer methods.

According to one aspect of the present invention, the position of a wafer mounted on the transfer arm is detected using one wafer detection sensor adapted to judge whether or not the wafer is passing therethrough. Therefore, it is possible to make a processing system at a low cost, and to easily layout the wafer detection sensors. In addition, according to another aspect of the present invention, since calculations are made in consideration of a correct diameter of the wafer which is determined based on wafer periphery data obtained when the orientation of the wafer is detected, it is possible to precisely determine the position of the center of the wafer.

BEST MODE FOR CARRYING OUT THE INVENTION

Figure 1:
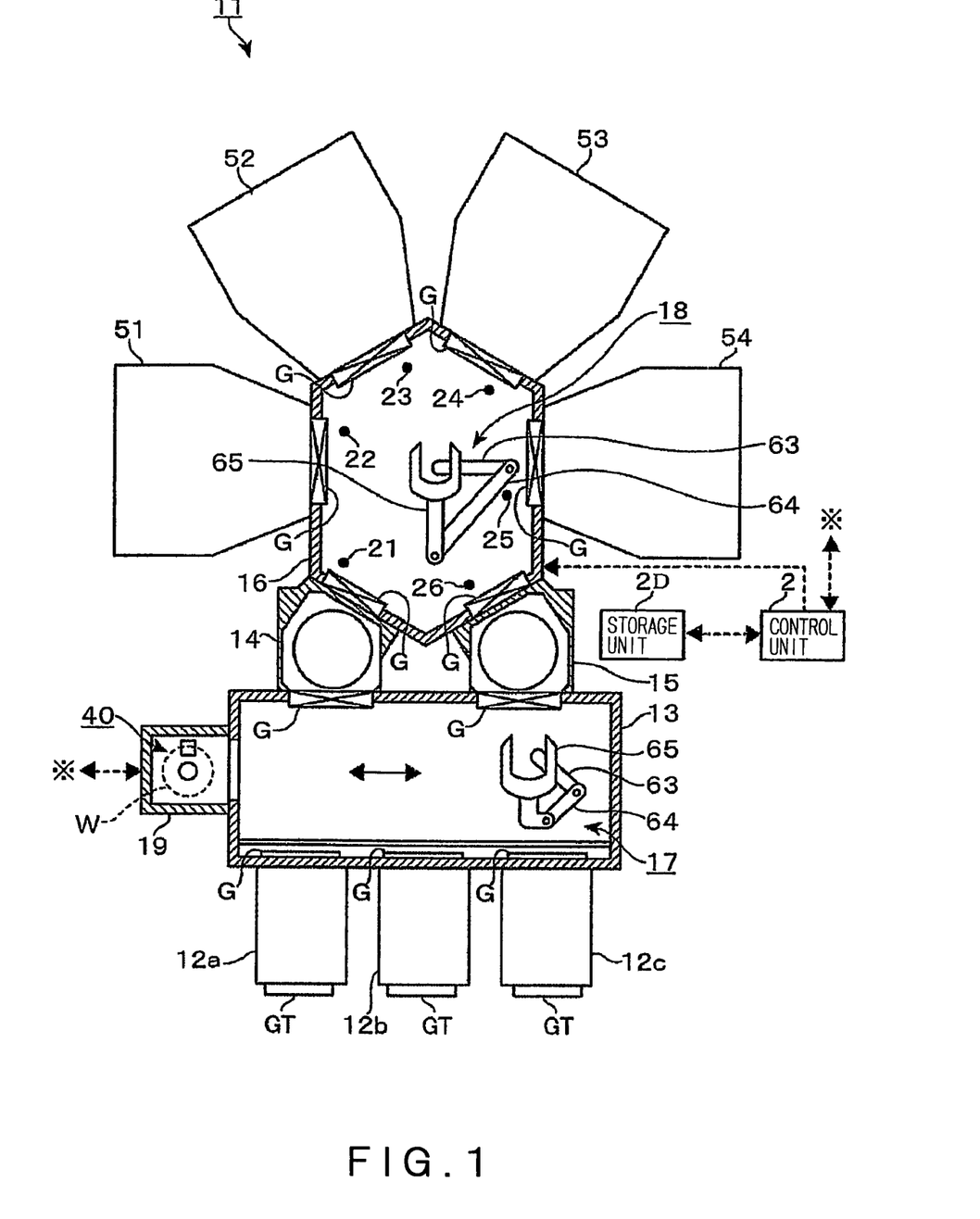
FIG. 1 is a plan view illustrating an example of a substrate processing system provided with a wafer transfer apparatus according to the present invention.

An example of a substrate processing system including a wafer transfer apparatus according to the present invention will be described with reference to FIG. 1. The substrate processing system 11 shown in FIG. 1 is generally called a cluster tool, a multi-chamber system, or the like. The substrate processing system 11 includes: carrier chambers 12a, 12b and 12c; a first transfer chamber 13, load lock chambers 14 and 15; a second transfer chamber 16; processing units (processing chambers) 51, 52, 53 and 54; and gate valves G for opening/closing each of the chambers (for simplicity, the same reference sign G is given to those gate valves). An alignment unit 19 is mounted to a side of the first transfer chamber 13. The alignment unit 19 houses an alignment mechanism 40 described later. Each of the load lock chambers 14 and 15 is provided with a vacuum pump and a leak valve (which are not shown) so that a wafer W can be transferred, through the load lock chamber 14 or 15, between the first transfer chamber 13 of ambient atmosphere under normal pressure and the second transfer chamber 16 of vacuum atmosphere.

The first transfer chamber 13 and the second transfer chamber 16 are provided therein with first transfer means 17 and second transfer means 18, respectively. The first transfer means 17 is an articulated transfer arm having three arms (arm elements) for transferring the wafer W between each of the carrier chambers 12a-12c and each of the load lock chambers 14 and 15, and between the first transfer chamber 13 and the alignment unit 19. The first transfer means 17 is configured to move along a straight line which is equidistance from a straight line connecting the load lock chambers 14 and 15 and a straight line connecting the carrier chambers 12a-12c, and is also configured to pivot about its center axis located on the straight line along which the first transfer means 17 moves. Although the number of the first transfer means 17 provided in this example is one, it may number two or more. The second transfer means 18 comprises an articulating transfer arm having three arms (arm elements) for transferring the wafer W between each of the load lock chambers 14 and 15 and each of the processing units 51-54. The second transfer means 18 is configured to pivot, and expand and contract, about the substantial center of the second transfer chamber 16 (more specifically, the center of a circle connecting the center of each mounting table provided in each of the processing units 51-54).

Figure 2:
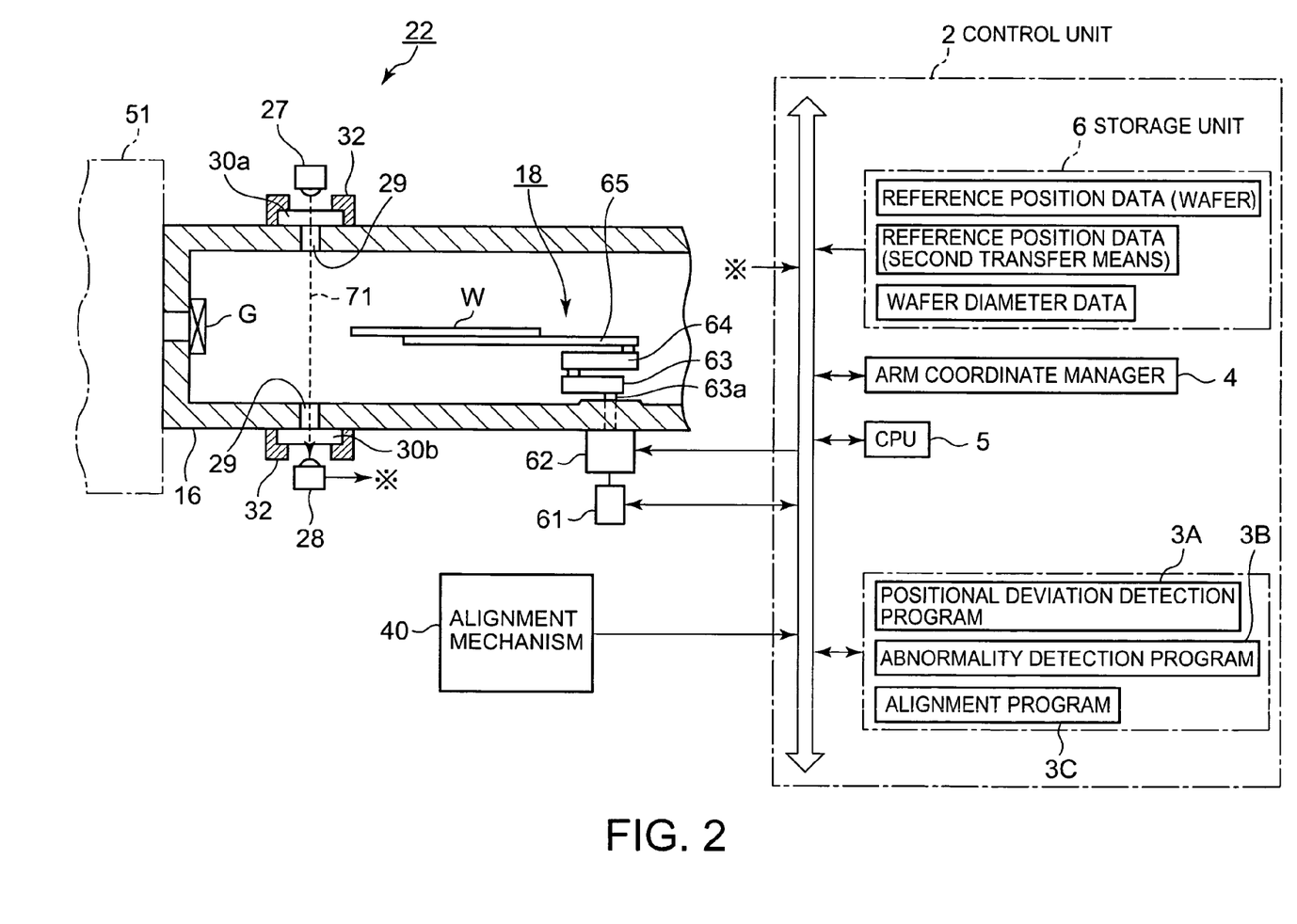
FIG. 2 is a longitudinal sectional view illustrating an example of a second transfer chamber provided in the substrate processing system.

The second transfer means 18 is schematically shown in FIG. 2. The second transfer means 18 includes a first arm 63, a second arm 64, and a third arm 65 having a horseshoe-shaped, holding part for holding the wafer W. The second transfer means 18 further includes a driver 62 having a motor for rotating a hollow rotating shaft 63a of the first arm 63 and a motor for expanding and contracting the articulating arm by rotating an internal shaft in the hollow rotating shaft 63a so as to drive pulleys (not shown) provided at respective joints and belts (not shown) between the pulleys. Each of the motors is provided with a pulse encoder 61 (only one pulse encoder is shown in FIG. 2 for simplicity of the drawing). An arm coordinate manager 4 of a control unit 2 (described later) manages the position of the holding part of the third arm 65 utilizing polar coordinate system (r, θ) on the basis of the outputs of the pulse encoders (61). Although the number of the second transfer means 18 provided in this example is one, it may number two or more.

As shown in FIG. 1, in the second transfer chamber 16, there are provided wafer detection sensors 21, 22, 23, 24, 25 and 26 (hereinafter simply referred to as "sensor(s)") in front of the respective gates G associated with the load lock chambers 14 and 15 and the processing units 51-54. Each of the sensors 21-26 is composed of a light-emitting element 27 is provided on the outside of a top wall of the second transfer chamber 16, and a light-receiving element 28 is provided on the outside of a bottom wall of the second transfer chamber 16 at a position right below the light-emitting element 27, so that there is provided a vertical optical axis 71 defining a detection area of each sensor and extending between the light-emitting element 27 and the light-receiving element 28. Openings 29 are formed in the parts, with which the optical axis 71 intersects, of the top and bottom walls of the second transfer chamber 16. The openings 29 are closed by light transmission windows 30a and 30b via O-rings (not shown), respectively. Each of the light transmission windows 30a are 30b is formed of a light-transmissive material, for example, transparent quartz.

A substantially ring-shaped pressing member 32 is provided on the outside of each of the light transmission windows 30a and 30b (more specifically, on the light-emitting element 27 side or on the light-receiving element 28 side). For example, this pressing member 32 is secured to the top or bottom wall of the second transfer chamber 16 by not shown bolts or the like, so that each of the light transmission windows 30a and 30b is in close contact with the top or bottom wall of the second transfer chamber 16 through the not shown O-ring. As a result, the air-tightness of the second transfer chamber 16 is ensured. Note that although FIG. 2 illustrates only the sensor 22, the other sensors 21 and 23-26 are configured and installed in the same manner.

Each of the sensors 21-26 is placed at such a position that, when a wafer is transferred by the second transfer means 18 through any one of the gate valves G associated with the load lock chambers 14 and 15 the processing units 51-54m, the wafer W (notably, peripheral portion thereof) interrupts the light beam (i.e., optical axis 71) in a detection area of the corresponding sensor. In other words, the wafer W is transferred from the second transfer chamber 16 to the load lock chambers 14 and 15 and the processing units 51-54 and vise versa along respective wafer transfer passages, and one sensor (21-26) is placed in each wafer transfer passage.

The light-emitting element 27 and the light-receiving element 28 are connected to the control unit 2 described later. In this example, when the wafer W is not passing through the optical axis 71 (Not-Passing), an ON signal is output from the light-receiving element 28; and when the wafer W is passing through the optical axis 71 (Passing), an OFF signal is output from the light-receiving element 28. Thus, whether or not the wafer W is passing is detected by use of the sensors 21-26.

Figure 3:
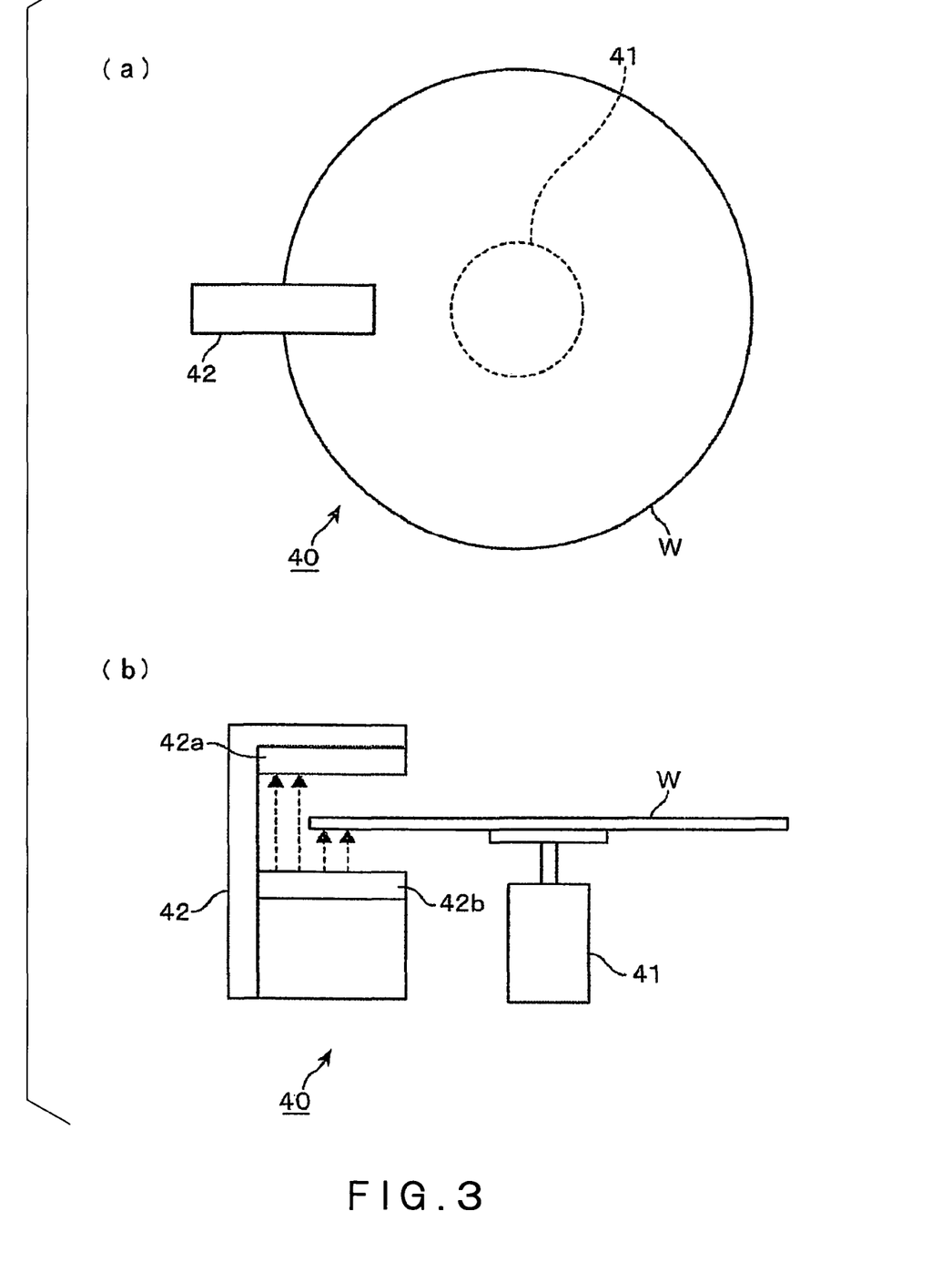
FIG. 3 shows a schematic plan view and a schematic side view each illustrating an example of an alignment mechanism provided in the substrate processing system.

As shown in FIG. 3, the alignment unit 19 is provided with the alignment mechanism 40 composed of a rotatable mounting table 41 and a detector 42. The detector 42 includes a light-receiving element 42a and a light-emitting element 42b that are located above and below the wafer W respectively so that the peripheral portion of the wafer W mounted on the rotatable mounting table 41 is placed between the light-receiving element 42a and the light-emitting element 42b. The light-emitting element 42b irradiates an area including the edge of the wafer W having a diameter of 300 mm (more specifically, for example, an area whose distance from the center of the wafer W ranges from about 140 mm to about 150 mm) with a infrared ray. The light-receiving element 42a receives a part of the infrared ray which varies depending on the position of the peripheral edge of the wafer W, so that the light-receiving element 42a is capable of detecting the position of the peripheral edge of the wafer W. The alignment mechanism 40 adjusts the orientation of the wafer W, and corrects the eccentricity of the wafer W in a manner described later.

Referring to FIG. 1, the processing units 51-54 are configured to perform a vacuum process such as etching of the wafer W using plasma, or a heat treatment. Each of the processing units 51-54 is configured so that the wafer W, which is carried into or it to be carried out of the processing unit through the gate valve G, is transferred between the processing unit and the second transfer means 18 using, for example, lift pins (not shown) provided in a mounting table (not shown) in the processing unit.

As shown in FIG. 2, the substrate processing system 11 has the control unit 2 that comprises, for example, a computer. The control unit 2 includes: the arm coordinate manager 4 that is equivalent to a position data acquiring means for acquiring position data of the second transfer means 18; a positional deviation detection program 3A for detecting a positional deviation (displacement) of the wafer W; an abnormality detection program 3B for detecting an abnormality of the second transfer means 18; and an alignment program 3C. In addition, reference numeral 5 denotes a CPU, and reference numeral 6 denotes a storage unit.

The arm coordinate manager 4 has a function of calculating the position of the second transfer means 18 on the basis of a pulse count value received from the pulse encoders 61 (to be more specific, an encoder connected to a motor used for the arm expansion and contraction, and an encoder connected to a motor used for the arm rotation) of the second transfer means 18. In practice, the arm coordinate manager 4 comprises programs and a memory. Here, "the position of the second transfer means 18" means, for example, the coordinates of the center of a wafer holding area of the holding part of the third arm 65 in a coordinate system whose origin point is the rotation center of the second transfer means 18 (the coordinates of the center of the wafer holding area corresponds to the coordinates of the center of the wafer W correctly held by the holding part). By counting the number of pulses of the encoders from a point of time at which the center of the holding area coincides with the origin point, polar coordinates (r, θ) of the center of the holding area can be obtained, and based on which the XY coordinates of the center of the holding area can be determined through coordinate conversion. Note that the above definition is mere an example. The origin point of the coordinate system may be set at a position corresponding to the home position of the second transfer means 18, and the position of the second transfer means 18 may be a position on the coordinate system determined based on the number of pulses of the pulse encoders 61 generated from a point of time at which the second transfer means 18 is in the home position.

The positional deviation detection program 3A is configured to detect the amount of positional deviation of the center of the wafer W held on the third arm 65 based on the position data of the second transfer means 18 obtained by the arm coordinate manager 4, ON/OFF signals received from the sensor 21 (22-26) (i.e., data on whether or not the wafer W is passing (the result of judgment)), reference position data of the wafer W, and the diameter of the wafer W.

In this example, the positional deviation detection program 3A also includes a group of steps for, if the amount of the positional deviation of the center of the wafer W exceeds a threshold value, stopping the operation of the second transfer means 18, and notifying of the abnormality (for example, a group of steps for outputting an alarm). Incidentally, the positional deviation detection program 3A may also be provided with a group of steps for, in response to the amount of the positional deviation of the center of the wafer W, correcting a target position to which the wafer W is delivered to the mounting table in each of the processing units 51-54 by the second transfer means 18.

The abnormality detection program 3B for detecting the abnormality of the second transfer means 18 is configured to calculate coordinates indicating the position of the second transfer means 18 when the second transfer means 18 starts passing through the detection area of the sensor 21 (or 22-26), or coordinates indicating the position of the second transfer means 18 when the second transfer means 18 completes passing through the detection area of the sensor 21, based on the position data of the second transfer means 18 acquired by the arm coordinate manager 4, ON/OFF signals received from the sensor 21 (i.e., data indicating Passing/Not Passing of the second transfer means 18 (the result of judgment)), and the reference position data of the second transfer means 18. The abnormality detection program 3B includes a group of steps for, if the amount of positional deviation of the second transfer means 18 exceeds a threshold value, stopping the operation of the second transfer means 18, and notifying of the abnormality (for example, a group of steps for outputting an alarm).

As will be described in detail later, the alignment program 3C includes a group of steps for acquiring data on the position of the peripheral edge of the wafer W (wafer edge position data) on the basis of an output signal of the light-receiving element 42 of the detector 42 of the alignment mechanism 40, and then for determining the orientation of the reference mark (e.g., a notch) of the wafer W on the basis of the wafer edge position data so that the wafer W is oriented toward a predetermined direction, and for determining the accurate diameter (correct diameter) of the wafer W.

Note that the reference position data of the wafer W, the reference position data of the second transfer means 18 and the correct diameter of the wafer W, are stored in the storage unit 6.

The programs 3A-3C (including programs relating to the input operation of process parameters, and relating to displaying of the process parameters) are stored in a storage unit 2D such as computer storage medium (e.g., a hard disk drive, a flexible disk, a compact disk, and a MO (magnetooptical disk)), and are installed in the control unit 2.

Figure 4:
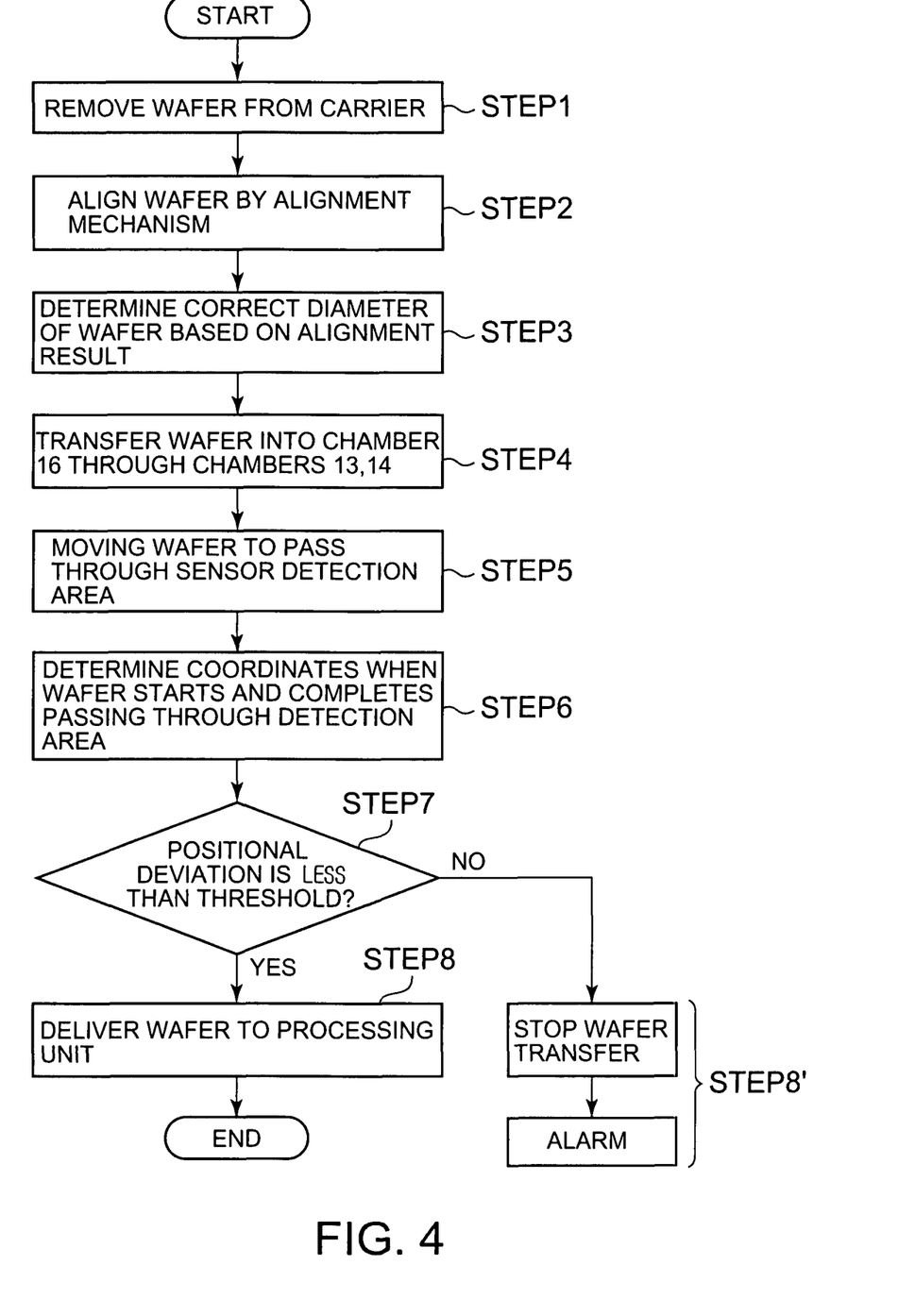
FIG. 4 is a flowchart illustrating an example of process steps performed in the substrate processing system.

Next, the operations, including the wafer transfer method according to the first embodiment of the present invention, of the substrate processing system 11 will be described with reference to FIG. 4-9. FIG. 4 is a flowchart illustrating the flow of process steps performed after the wafer W is carried into the substrate processing system 11 until the wafer W is carried into any one of the processing units 51-54.

First, a carrier which is a transport container of the wafer W is carried into one of the carrier chambers 12a-12c through a gate door GT from the atmospheric side. Thereafter, the wafer W having a diameter of, for example, 300 mm is carried into the first transfer chamber 13 by the first transfer means 17 (Step 1, FIG. 4). Next, the wafer W is transferred to the alignment mechanism 40 in the alignment unit 19 by the first transfer means 17; and then the orientation of the wafer W is adjusted, and the eccentricity of the wafer W is corrected (Step 2).

Figure 5:
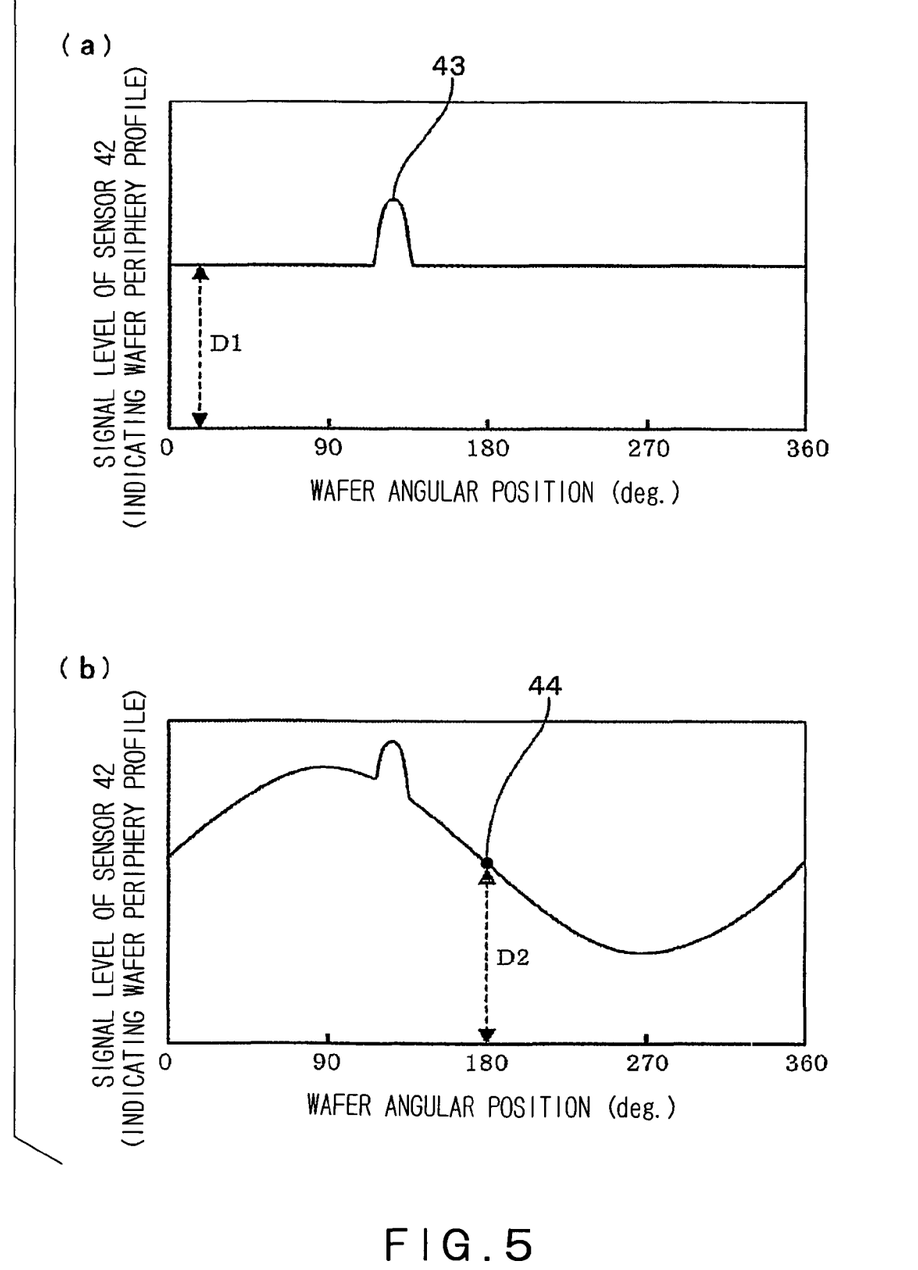
FIG. 5 shows graphs each explaining an operation of the alignment mechanism.

In detail, when the wafer W is mounted on the rotatable mounting table 41 in the alignment unit 19, the mounting table 41 rotates. Then, an infrared ray is emitted from the light-emitting element 42b to the light-receiving element 42a. Since the infrared ray is emitted to an area including the edge of the wafer W having a diameter of 300 mm as previously described and the light-receiving element 42a is configured, for example, to output a detection signal whose intensity is proportional to an area of the light-receiving element 42a on which the infrared ray emitted by the light-emitting element 42b falls, the profile (i.e., change in the radial position of the edge of the wafer with respect to the angular position of the wafer) of the peripheral edge of the wafer W can be detected by the light-receiving element 42a as shown in FIG. 5(a). Since the peripheral portion of the wafer W has a cut-out called a notch or an orientation flat, a projection 43 corresponding to the cut-out appears in the detection signal as shown in FIG. 5(a). The waveform shown in FIG. 5(a) corresponds to the profile of the peripheral edge of the wafer W and expresses a boarder line between an area (i.e., area above the waveform) corresponding to an area of the light-receiving element 42a on which the infrared ray does not fall due to interruption by the wafer W and an area (i.e., area below the waveform) corresponding to an area of the light-receiving element 42a on which the infrared ray falls without interrupted by the wafer W. Note that the waveform shown in FIG. 5(a) is obtained if a notch is formed on the wafer W as the cut-out.

If the wafer W is mounted on the rotatable mounting table 41 while they are concentric with each other, a waveform excluding the projection 43 is flat as shown in FIG. 5(a). On the other hand, if the wafer W is eccentric to the mounting table 41, a waveform having a sine-curve shape appears as shown in FIG. 5(b). Thus, it is possible to determine, based on the waveform, the positional deviation (eccentricity) of center of the wafer W with respect to the center (i.e., rotation axis) of the rotatable mounting table 41 on which the wafer W is mounted.

A value of D1 in FIG. 5(a) correspond to the diameter of the wafer W; and a value of D2 in FIG. 5(b) corresponding to the inflection point 44 of the sine-curve corresponds to the diameter of the wafer W. Data of the correct diameter (for example, 300.00 mm) of the wafer W calculated based on the value D1 or D2 is stored in the storage unit 6 (Step 3).

To be more specific, the diameter of the wafer W is in a specific range (for example, 300.00 mm±200 nm) defined by a certain manufacturing standards, in other words, the diameter of the wafer has a specific tolerance range (for example, ±200 nm). The correct (accurate) diameter including the tolerance of the diameter may be determined by the foregoing method utilizing the data obtained during alignment of the wafer W by the alignment mechanism 40 utilizing a previously-obtained relationship (equation) between the correct diameter of the wafer W and the foregoing value D1 or D2.

Then, the rotatable mounting table 41 stops such that the cut-out of the wafer W locates at a predetermined angular position. Next, the wafer W is transferred to the first transfer chamber 13 again by the first transfer means 17. If the wafer W is mounted on the rotatable mounting table 41 at a position at which the position of the center of the wafer deviates from the center of the rotatable mounting table 41 (i.e., in a case where a substantially sine shaped waveform shown in FIG. 5(b) is obtained by the alignment unit 19), the first transfer means 17 receives the wafer W in such a manner that the positional deviation of the center of the wafer is corrected (canceled) based on the positional deviation determined during the alignment operation as mentioned above, so that the holding part of the first transfer means 17 correctly hold the wafer W.

Next, the wafer W is transferred to the load lock chamber 14 (or 15) by the first transfer means 17. After the atmosphere in the load lock chamber 14 (or 15) is evacuated by the not shown vacuum pump, the wafer W is carried into the second transfer chamber 16 by the second transfer means 18 through the gate valve G (Step 4).

Figure 6:
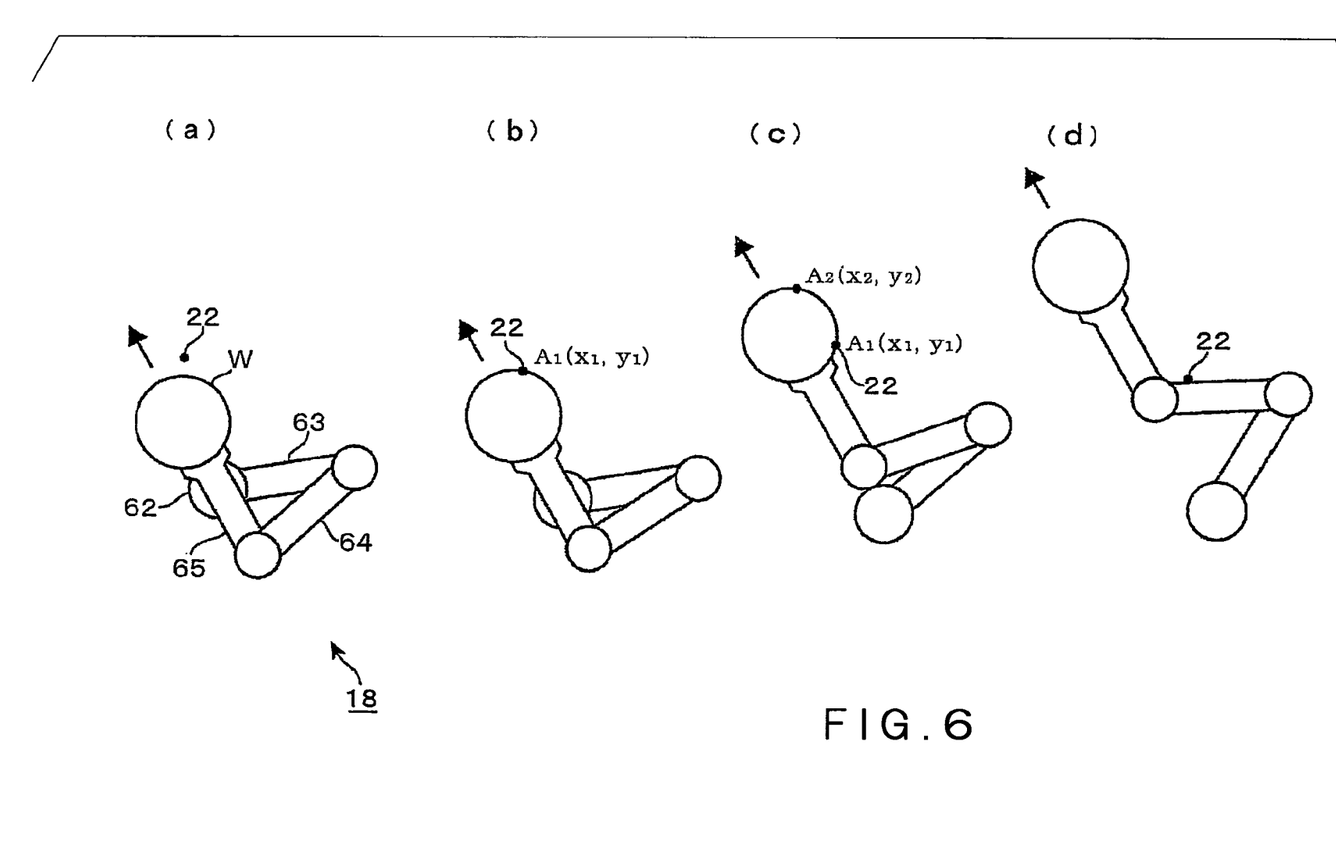
FIG. 6 shows plan views of a second transfer means illustrating the operation thereof.
Figure 7:
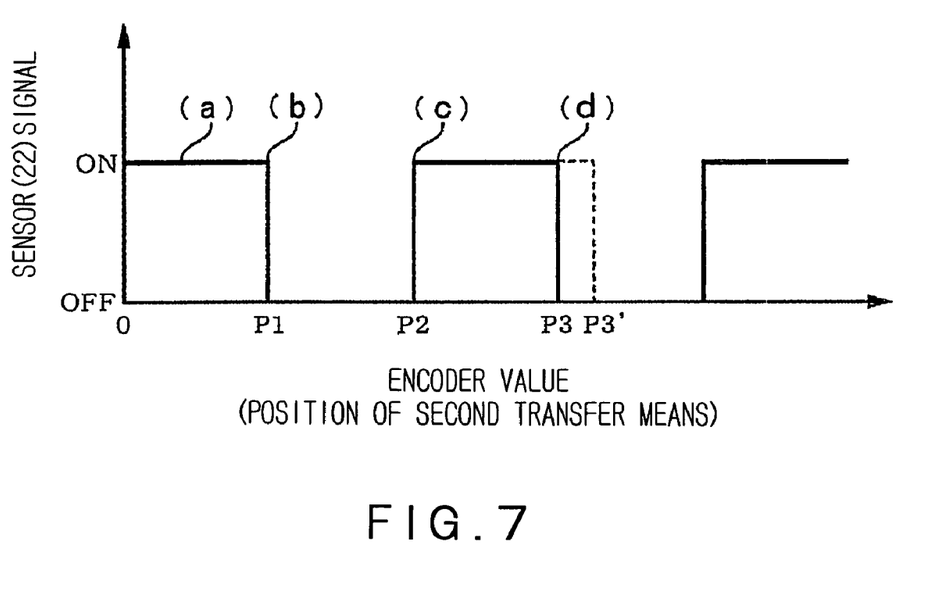
FIG. 7 is a graph showing the relationship between a sensor signal and an encoder value obtained during the operation of the second transfer means.
Figure 8:
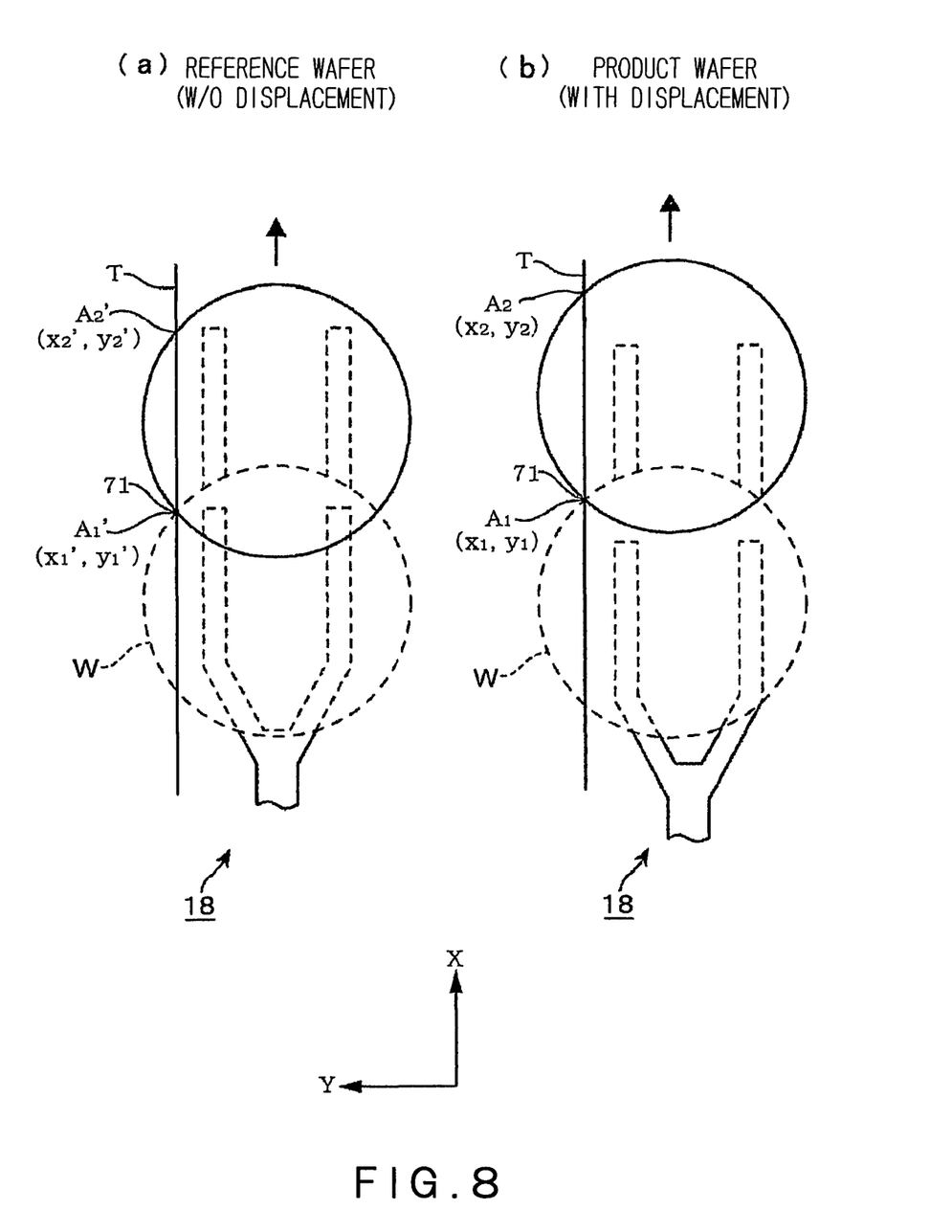
FIG. 8 shows diagrams illustrating a method of calculating the position of the center of a substrate.

Then, the wafer W is transferred straight (linearly) towards one processing unit, for example, the processing unit 51, by the second transfer means 18. At this time, as shown (a) to (c) of FIG. 6, the wafer W travels so as to interrupt the optical axis 71 which is the detection area of the sensor 22, and eventually the wafer W has passed through the detection area of the sensor 22 (Step 5). As a result, as shown in FIG. 7, the sensor signal is switched from ON to OFF at the point of time when the wafer W starts passing through the optical axis 71, and is then switched from OFF to ON at the point of time when the wafer W completes passing through the optical axis 71. On the other hand, since the position (coordinates) of the second transfer means 18 is acquired by the arm coordinate manager 4, the control unit 2 recognizes the position of the second transfer means 18 at which the wafer W starts passing though the optical axis 71 of the sensor 22, and the position of the second transfer means 18 at which the wafer W completes passing through the optical axis 71. If those positions are known, as shown in FIG. 8B, coordinates A1 (x1, y1) and A2 (x2, y2) of the intersection points between the peripheral edge of the wafer W and a straight line T which passes through the optical axis 71 and which is parallel to the transfer passage of the third arm 65 can be determined by calculation (Step 6). As a result, the amount of positional deviation of the center of the wafer W from the reference position can be calculated (Step 7). The way how to acquire the intersection point coordinates A1 and A2, and how to calculate the amount of the positional deviation of the center of the wafer from the reference position, will be described below.

It should be noted that, since the calculation is performed in order to grasp the amount of the displacement (positional deviation) of the wafer W with respect to the correct position wafer W at which the wafer W should be held on the second transfer means 18 (the holding area of the third arm 65), it is sufficient if a relative position of the center of the wafer W with respect to the center of the holding area of the third arm 65 is obtained.

First, an experimental operation is performed while the wafer W is held at the correct position on the second transfer means 18. FIG. 8 (a) is a plan view showing the wafer W correctly held by the second transfer means 18 and passing through the optical axis 71. In order to simplify the explanation, an X-Y orthogonal coordinate system is used. The X-Y coordinate system is such that: the origin point thereof coincides with the rotation center of the second transfer means 18; and the wafer W travels in the X-axis direction. The straight line T passing through the optical axis 71 is parallel to the X-axis direction. The coordinates A1' (x1', y1') of the intersection points between the peripheral edge of the wafer W and the straight line T when the wafer W starts passing through the optical axis 71 of the sensor 22, and the coordinates A2' (x2', y2') of the intersection point between the peripheral edge of the wafer W and the straight line T when the wafer W completes passing through the optical axis 71 of the sensor 22 can be calculated based on the sensor signals of the sensor 22 and encoder values (P1 and P2 shown in FIG. 7) of the second transfer means 18 through coordinate conversion from the polar coordinate to the X, Y orthogonal coordinate. Since the position of the second transfer means 18 can be calculated from the encoder values of the second transfer means 18 obtained by the arm coordinate manager 4, it is possible to acquire coordinates at which the wafer W starts passing through the sensor 22 and coordinates at which the wafer W completes passing through the sensor 22. Those coordinates correspond to the coordinates A1' (x1', y1') and A2' (x2', y2').

Then, as shown in FIG. 8 (b), when a product wafer W is transferred by the second transfer means 18 during the operation of the substrate processing system 11, the coordinates when the wafer W starts passing through the optical axis 71 and the coordinates when the wafer W completes passing through the optical axis 71 are determined in the same manner as described above. In FIG. 8 (b), symbols which are the same as those in FIG. 8(a) except that dash marks (') are excluded are used to indicate the corresponding status of the wafer W. Therefore, the coordinates of the intersection point when the wafer W starts passing through the optical axis 71 and the coordinates of the intersection point when the wafer W completes passing through the optical axis 71 are expressed as A1 (x1, y1) and A2 (x2, y2), respectively.

Figure 9:
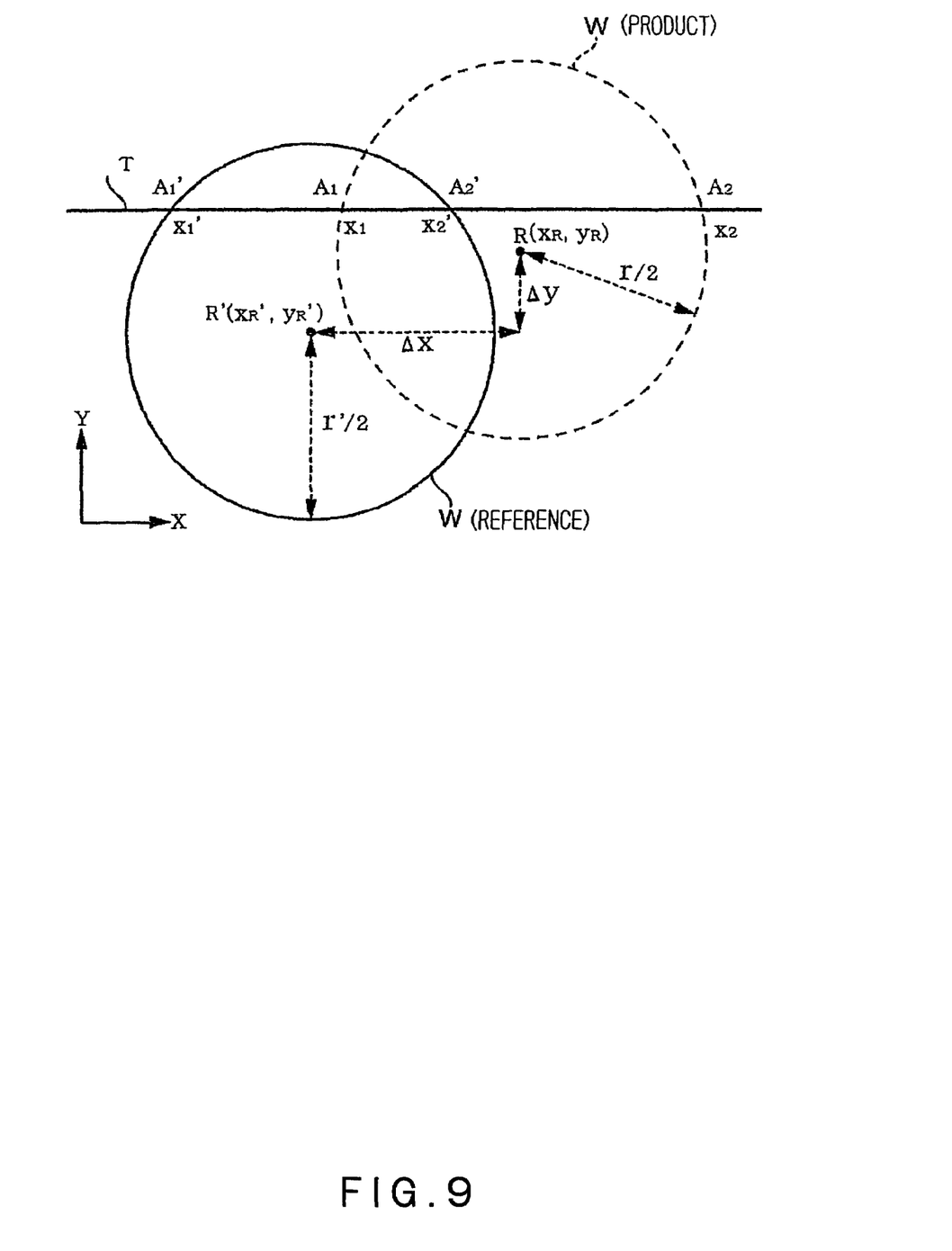
FIG. 9 is a diagram illustrating a method of calculating the amount of positional deviation of the center of a substrate.

FIG. 9 is a diagram simply illustrating a state in which both of the wafers W shown in (a) and (b) of FIG. 8 complete passing through the sensor 22. Incidentally, since all the Y-coordinate values of the coordinate positions correspond to the straight line T, the Y-coordinate values are identical to one another. For this reason, the Y-coordinate values are omitted. Assuming that the coordinates of the center of the wafer (reference wafer) correctly mounted on the second transfer means 18 (i.e., the reference position of the wafer W) is R' ($X_{R'}$, $Y_{R'}$) and the diameter of the reference wafer is (r') and that the coordinates of the center of the product wafer mounted on the second transfer means 18 (with some degree of displacement) is R ($X_R$, $Y_R$), and the diameter of the product wafer is (r), X and Y components Δx and Δy of difference between the coordinates R' and R can be calculated according to the following equations utilizing Pythagorean theorems or the like:

$$\Delta x = \left| \frac{x_1 + x_2}{2} - \frac{x'_1 + x'_2}{2} \right| \quad (1)$$

$$\Delta y = \left| \sqrt{\left(\frac{r'}{2}\right)^2 - \left(\frac{x'_2 - x'_1}{2}\right)^2} - \sqrt{\left(\frac{r}{2}\right)^2 - \left(\frac{x_2 - x_1}{2}\right)^2} \right| \quad (2)$$

In FIG. 9, the parameters are as follows:
R' ($x_{R'}$, $y_{R'}$): coordinates of center of reference wafer;
R ($x_R$, $y_R$): coordinates of center of product wafer;
r': diameter of reference wafer;
r: diameter of product wafer;
A1': coordinates of reference wafer when staring passing sensor;
A2': coordinates of reference wafer when completing passing sensor;
A1: coordinates of product wafer when staring passing sensor;
A2: coordinates of product wafer when completing passing sensor;
Δx: difference in x-component between coordinates A1 and A'; and
Δy: difference in y-component between coordinates A2 and A2'.

In the above step 3, the diameter r' of the reference wafer W and the diameter r of the product wafer W are calculated by the alignment mechanism 40 beforehand. Here, the calculated diameters r' and r are, for example, 300.00 mm and 300.02 mm, respectively. Therefore, the amount of positional deviation of the center of the wafer W from the reference position which varies depending on the conditions of each wafer W can be calculated.

It should be noted that it is sufficient if the difference between x1 and x2, the difference between x1' and x2', and the difference between the average of x1 and x2 and the average of x1' and x2' are known. Thus, each of the values x1, x2, x1' and x2' used in the above equations (1) and (2) may be an encoder value itself (but it should be converted into X-coordinate value) of the second transfer means 18 obtained when the wafer W starts passing through the optical axis 71 or the coordinates when the wafer W completes passing through the optical axis 71.

If the amount of the positional deviation of the center of the wafer W is equal to or smaller than a predetermined threshold value, the wafer W is carried into the processing unit 51 as scheduled (Step 8). However, if the amount of the positional deviation exceeds the threshold value, the transfer of the wafer W stops, and an alarm is issued (Step 8'). Note that, if it is judged that the difference between the center coordinates R of the wafer W and the reference position R' (i.e., the amount of the positional deviation) is equal to or smaller than the threshold value, the second transfer means 18 mounts the wafer W on the mounting table of the processing unit 51 so that the center of the wafer W is aligned with the center the mounting table, more specifically, so that the amount of the positional deviation from the reference position of the wafer W is corrected or canceled.

Subsequent to the forgoing steps, the following step is performed in this embodiment. That is, after the wafer W passes through the sensor 22 as shown in FIG. 6 (c), the second arm 64 passes through the detection area of the sensor 22 as shown in FIG. 6(d). At this time, it is possible to judge whether or not there is a positional deviation of the second transfer means 18 based on the encoder value (indicating the position of the second transfer means 18) when the sensor (22) signal is switched. FIG. 7 also shows an encoder value obtained when the sensor signal switched from ON to OFF due to the passage of the second arm 64 through the detection area of the sensor 22 as shown in FIG. 6 (d).

As previously described, the second transfer means 18 may displaces from its reference position due to distortion or abrasion of a rotating shaft inside the second transfer means 18, stretch of a belt, backlash of a driving mechanism, or the like. However, by comparing position data of the second transfer means 18 obtained when the second arm 64 passes through the sensor 22 with its reference position data, it is possible to detect the displacement (positional deviation) of the second transfer means 18. The reference position data indicates the position of the second transfer means 18 when the second transfer means. 18 in normal conditions and in normal operation interrupts the optical axis 71 of the sensor 22. For example, assuming that encoder value P3 (FIG. 3) corresponds to the reference position of the second transfer means 18, if encoder value P3' is obtained during the practical operation of the second transfer means 18, it is found that the second transfer means 18 displaces from its reference position toward the rotation center of the second transfer means 18.

According to the foregoing embodiment, since the amount of positional deviation from the reference position R' of the wafer W is determined by using a single sensor, the substrate processing system 11 can be made at low cost, and it is possible to easily layout the second transfer means 18 and the sensors 21-26. This facilitates the design of the substrate processing system 11. In addition, an error in determining the position which may occur due to the use of plural sensors cooperating with each other can be avoided.

Moreover, even if the diameter "r" slightly differs wafer to wafer, the position of each wafer (i.e., coordinates R) can be determined precisely by including in the equation the correct diameter "r" of the wafer W determined with the use of the alignment mechanism 40. In addition, the determination process of the correct diameter "r" of the wafer W uses data obtained in the past step, that is, the data obtained when the alignment unit 19 adjusts the orientation of the wafer W and corrects the eccentricity of the wafer W. Thus, if the relationship between the data obtained by the alignment mechanism 40 and the correct (actual) diameter "r" of the wafer W is known (the relationship can be obtained through experiment using wafers of various diameters), the correct diameter "r" of the wafer W can be determined by calculation without performing a separate measuring step only for determining the correct diameter "r".

Furthermore, in the foregoing embodiment, since the amount of positional deviation from the reference position R' of the wafer W is measured before the wafer W is carried into a processing unit (51), appropriate countermeasure against the positional deviation (i.e., wafer transfer stop, or wafer position correction) reflecting the measurement result can be taken before the wafer W is processed in the processing unit. As a result, it is possible to improve the in-plane uniformity of the process of the wafer W, and to improve yields.

Moreover, as described above, the center coordinates R of the wafer W are measured while the wafer W is being transferred, and it is not necessary to keep the wafer W in a standstill state. Therefore, it is possible to detect the amount of positional deviation from the reference position R' of the wafer W without decreasing the productivity. By accumulating the position data of the wafer W, and then by analyzing the tendency and frequency distribution of the position data, it is possible to improve the product quality, and the like.

Furthermore, by detecting the positional deviation of the second transfer means 18, it is possible to detect a malfunction of the second transfer means 18, and based on the detection result, it is possible to prevent the wafer W from being damaged by colliding with a wall surface in the substrate processing system 11 while the wafer W is transferred. Furthermore, by detecting the position of the second transfer means 18 every time when it transfers wafer W to accumulate data of the positions, it is possible to estimate the failure time of the second transfer means 18, and to detect an abnormality before any problem on the quality of the wafer W occurs. The detection of the position of the second transfer means 18 can be performed during usual operation, in other words, without performing a separate detecting step only for determining the position of the second transfer means 18. Therefore, it is possible to detect the position of the second transfer means 18 without decreasing the productivity. Note that the detection of the position of the second transfer means 18 may be performed when the second transfer means 18 is standing-by for the next transfer operation.

In the foregoing embodiment, although transmission optical sensors are used as the sensors 21-26, reflection optical sensors may be used instead. In one example, each of the reflection sensors having a light-emitting element and a light-receiving element may be provided on the bottom wall of the second transfer chamber 16. When a wafer W interrupts an optical axis (71) of the reflection sensor, the light-receiving element receives light reflected by the back surface of the wafer W. In this case, when the wafer W is not passing through the detection area of the sensor, the sensor signal is OFF (reflected light is not-received); and when the wafer W is passing through the second transfer chamber 16, the sensor signal is ON (reflected light is received).

In the foregoing embodiment, the correct diameter "r" of the wafer W, which has been determined by the alignment mechanism 40, is used in the calculation. However, the calculation may also be made using the nominal diameter "r" of the wafer W (e.g., 300 mm), which includes an error to some extent, instead of using the correct diameter "r".

Moreover, in the foregoing embodiment, the reference position R' of the wafer W is calculated using the result of the test operation which is performed while the wafer W is held at the correct position of the holding part of the second transfer means 18. However, the reference position R' may also be determined only by calculation (i.e., without transfer operation). This is because the distance of the center of the wafer W (reference position R') mounted on the second transfer means 18 in ideal conditions from the origin point of the second transfer means 18 can be determined only by calculation. Accordingly, "Δx" and "Δy" can be determined using the coordinates R' determined only by calculation.

The second embodiment of the present invention will be described. The foregoing sensors 21-26 are disposed in the second transfer chamber 16 of a vacuum atmosphere in the first embodiment. However, such a sensor may be disposed in the first transfer chamber 13 of an ambient atmosphere in order to detect the positional deviation of the center of the wafer W mounted on the first transfer means 17. The second embodiment is configured to achieve the above, and will be describe with reference FIGS. 10 and 11. The first transfer means 17 has a first arm 63, a second arm 64 and a third arm 65, which are similar to those in the first embodiment and are mounted on a rotatable stage 68. Each of these arms 63-65 can rotate relative to the underlying member (64, 65, 68) about the joint connecting each arm and the underlying member as an rotation axis, so that the first transfer means 17 can rotate about its rotation center and expand and retract. Incidentally, although the actual substrate processing system 11 are provided with two sets of the first, second, and third arms 63, 64, 65 (more specifically, the upper and lower sets), only one set of the first, second, and third arms 63, 64, 65 are illustrated for simplicity of the explanation. A sensor 67 including a light-emitting element 67a and a light-receiving element 67b is secured to the rotatable stage 68 via a fixture 66. Accordingly, the sensor 67 is moved together with the first transfer means 17, and rotates in synchronization with the rotation of the rotatable stage 68. The light-emitting element 67a and the light-receiving element 67b are vertically arranged such that the wafer W to be transferred by the first transfer means 17 is passed through the space between the light-emitting element 67a and the light-receiving element 67b. As is the case with the above-described sensors 21-26, when the wafer W passes the detection area of the sensor to interrupt the light emitted by the light-emitting element 67a, encoder values of motors of the first transfer means 17 are detected. Based on the encoder values, the coordinates of the wafer at a point of time at which the wafer starts passing through the detection area and at a point of time at which the wafer completes passing through the detection area.

Figure 10:
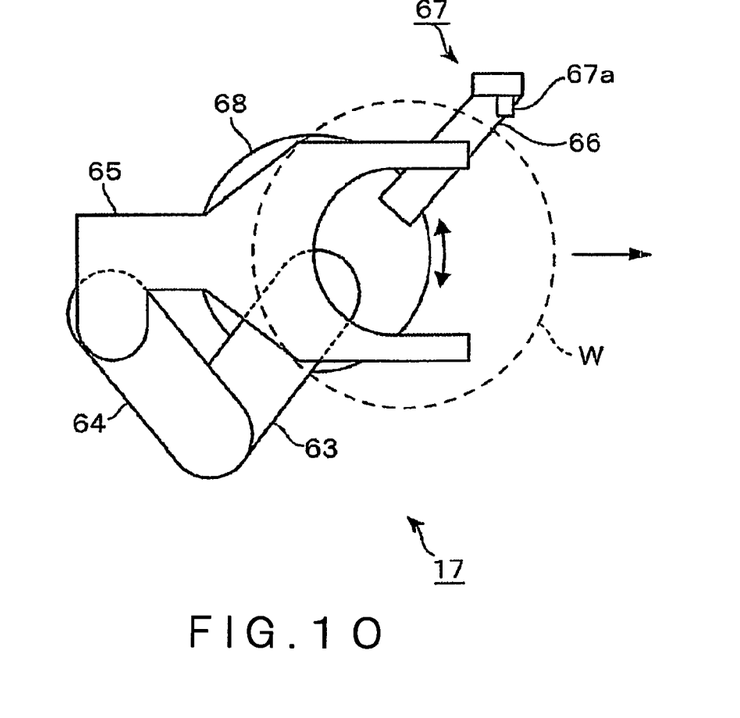
FIG. 10 is a plan view illustrating an example of a first transfer means according to the present invention.
Figure 11:
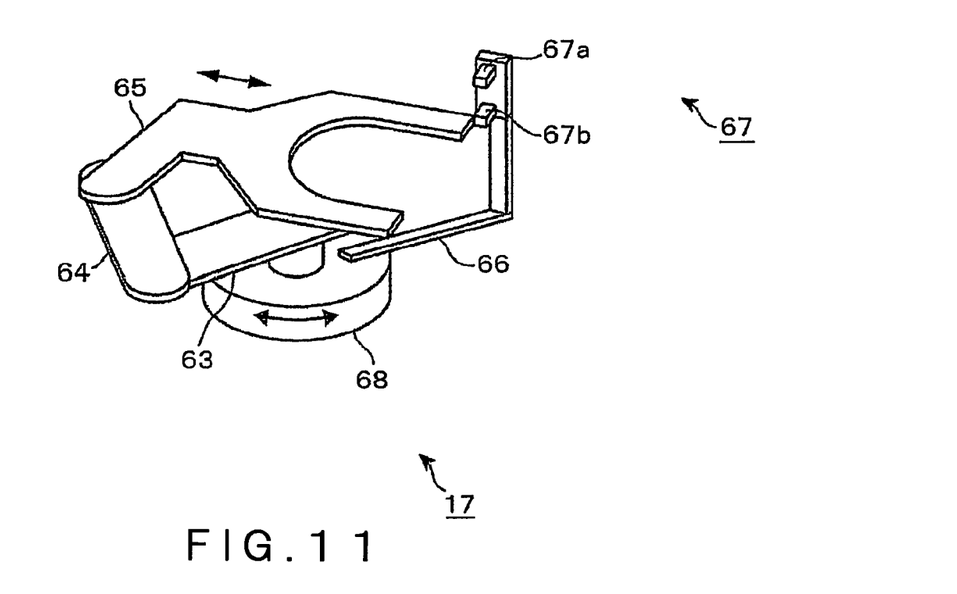
FIG. 11 is a perspective view illustrating the example of the first transfer means.

When a wafer W is carried into the load lock chamber 14 or 15 from the first transfer chamber 13, coordinates of the position of the center of the wafer W is calculated on the basis of position data of the first transfer means 17 and encoder values obtained when the sensor 67 signal is switched from ON to OFF and OFF to ON in a manner similar to that in the first embodiment. After that, the difference between the center position and reference position of the wafer W is compared with a threshold value. According to programmed operation, if the difference is equal to or larger than the threshold value, an alarm is issued and the transferring of the wafer W is stopped, or the center position of the wafer W is corrected when the wafer W is mounted on a not shown mounting table in the load lock chamber 14 or 15.

The foregoing configuration makes it possible detect the position of the center of the wafer W by a simpler structure, without providing plural sensors 67 in the first transfer chamber 13.

Although the sensor 67 is secured to the first transfer means 17 using the fixture 66 in the foregoing embodiment, the sensor 67 may be disposed in the first transfer chamber 13 at a position in front of each of the load lock chambers 14 and 15 in a manner similar to that of the sensors 21-26 in the second transfer chamber 16.

In addition, in the first embodiment, instead of disposing the sensors 21-26 on the inside of the second transfer chamber 16, a single sensor may be mounted to the hollow rotating shaft 63a of the second transfer means 18 in a manner similar to that of disposing the sensor 67, so that the single sensor rotate together with the second transfer means 18.

Moreover, when the wafer W is carried into the load lock chamber 14 or 15, the first transfer means 17 may also be operated so that the second arm 64 passes through the detection area of the sensor 67 to detect the positional deviation of the first transfer means 17 in a manner similar to that of detecting the positional deviation of the second transfer means 18 in the first embodiment.

In the first and second embodiments, although one sensor (21-26, 67) is disposed in one wafer transfer passage, plural (e.g., two) sensors may also be disposed in one wafer transfer passage. In this case, the amount of the positional deviation of the wafer W can be calculated plural times, which is equivalent to the number of sensors. In this case, it is possible to determine the average value of the amount of the positional deviation, and thereby to correct the positional deviation of the wafer W on the basis of the average value. As a result, it is possible to reduce a calculation error.

The invention claimed is:

1. A wafer transfer apparatus that transfers a wafer at least between a transfer chamber and at least one first chamber connected to the transfer chamber via a gate valve, said wafer transfer apparatus comprising:
   a transfer arm provided in the transfer chamber to load and unload the wafer to and from the first chamber;
   an aligner, having a rotary stage and an aligning sensor, configured to rotate the wafer by the rotary stage with the aligning sensor sensing a circumference of the wafer and so as to adjust an orientation of the wafer based on a sensing signal of the aligning sensor, before the transfer arm transfers the wafer from the transfer chamber to the first chamber:
   at least one wafer detection sensor provided to detect whether or not the wafer held by the transfer arm is passing across a light path of the detection sensor when the transfer arm moves to load the wafer into the first chamber, wherein one wafer detection sensor is provided for detecting passage of the wafer being loaded into each first chamber;
   position data acquiring means that acquires position data of the transfer arm based on an amount of driving of the transfer arm;
   a storage unit that stores reference position data corresponding to a reference position of the wafer mounted on the transfer arm;
   wafer diameter determining means that determines an actual diameter of the wafer based on a detection signal of the aligning sensor; and
   calculation means that determines, based on the position data acquired by the position data acquiring means and a result of judgment of the wafer detection sensor, position data of the transfer arm at a point of time at which the wafer starts passing across the light path of the wafer detection sensor, and position data of the transfer arm at a point of time at which the wafer completes passing across the light path, and then calculates an amount of positional deviation of a center of the wafer based on those position data of the transfer arm thus determined, the reference position data and the actual diameter of the wafer.

2. The wafer transfer apparatus according to claim 1, wherein the transfer arm is configured to be driven such that the wafer passes linearly through the light path of the wafer detection sensor.

3. The wafer transfer apparatus according to claim 1, further comprising:
   judgment means that judges whether or not the amount of the positional deviation of the center of the wafer exceeds a threshold value; and alarm means that alarms that the amount of deviation exceeds the threshold value.

4. The wafer transfer apparatus according to claim 1, further comprising judgment means that judges whether or not the amount of the positional deviation of the center of the wafer exceeds a threshold value, wherein the transfer arm is configured to mount the wafer to the first chamber so that the positional deviation of the center of the wafer is corrected, if it is judged that the amount of the positional deviation does not exceed the threshold value.

5. A wafer transfer method for transferring a wafer at least between a transfer chamber and at least one first chamber connected to the transfer chamber via a gate valve, said method comprising the steps of:
   rotating the wafer by a rotary stage of an aligner with an aligning sensor of the aligner sensing a circumference of the wafer, in order to adjust an orientation of the wafer based on detection signal of the aligning sensor;
   determining an actual diameter of the wafer based on a sensing signal of the aligning sensor;
   conveying the wafer from the aligner to the transfer arm provided in the transfer chamber;
   moving the transfer arm to allow the wafer to pass across a light path of one wafer detection sensor, and thereafter to be loaded into the first chamber, the wafer detection sensor being configured to be capable of detecting whether or not the wafer held by the transfer arm is passing across the light path of the detection sensor;

detecting passage of the wafer across the light path of the wafer detection sensor by means of the wafer detection sensor;

acquiring first position data of the transfer arm at a point of time when the wafer starts passing across the light path, based on an amount of driving of the transfer arm;

acquiring second position data of the transfer arm at a point of time when the wafer completes passing across the light path, based on an amount of driving of the transfer arm; and calculating an amount of positional deviation of a center of the wafer based on the first and second position data of the transfer arm, reference position data corresponding to a reference position of the wafer mounted on the transfer arm, and the actual diameter of the wafer.

6. The wafer transfer method according to claim 5, wherein, in the step of moving the transfer arm, the transfer arm is driven such that the wafer passes linearly through the light path of the wafer detection sensor.

7. The wafer transfer method according to claim 5, further comprising the steps of:

detecting passage of the transfer arm through the detection area of the wafer detection sensor by means of the wafer detection sensor, when moving the transfer arm;

acquiring third position data of the transfer arm at a point of time when the transfer arm starts passing or completes passing through the detection area, based on an amount of driving of the transfer arm; and judging whether or not the transfer arm is in normal operation, by comparing the third position data of the transfer arm with position data to be obtained when the transfer arm is in normal operation.

8. The wafer transfer method according to claim 5, further comprising a step of judging whether or not the amount of the positional deviation of the center of the wafer exceeds a threshold value, and notifying that an abnormality occurs if it is judged that the amount of the positional deviation of the center of the wafer exceeds the threshold value.

9. The wafer transfer method according to claim 5, further comprising a step of judging whether or not the amount of the positional deviation of the center of the wafer exceeds a threshold value, and mounting the wafer to a transfer destination in the first chamber so that the positional deviation of the center of the wafer is corrected if it is judged that the amount of the positional deviation does not exceed the threshold value.

10. A storage medium storing a computer program operable on a computer for controlling a wafer transfer apparatus, wherein the computer program includes programmed steps of executing the wafer transfer method according to claim 5.

11. The wafer transfer apparatus according to claim 1, wherein only one wafer detection sensor is provided for detecting passage of the wafer being loaded into each first chamber.

* * * * *